United States Patent
Yang

(10) Patent No.: US 6,649,526 B2
(45) Date of Patent: Nov. 18, 2003

(54) METHOD FOR IMPLANTING AND CODING A READ-ONLY MEMORY WITH AUTOMATIC ALIGNMENT AT FOUR CORNERS

(75) Inventor: Chun Yi Yang, Chutong (TW)

(73) Assignee: Macronix International Co., Ltd., Hsinchu (TW)

( * ) Notice: Subject to any disclaimer, the term of this patent is extended or adjusted under 35 U.S.C. 154(b) by 82 days.

(21) Appl. No.: 09/987,525

(22) Filed: Nov. 15, 2001

(65) Prior Publication Data

US 2003/0092275 A1 May 15, 2003

(51) Int. Cl.[7] ............................................. H01L 21/311
(52) U.S. Cl. ........................ 438/700; 438/703; 438/720
(58) Field of Search ................................. 438/700, 702, 438/703, 720, 723, 299

(56) References Cited

U.S. PATENT DOCUMENTS 4,258,378 A * 3/1981 Wall ............................ 257/316
5,536,669 A * 7/1996 Su et al. ...................... 438/276
5,665,621 A * 9/1997 Hong .......................... 438/278
5,691,216 A * 11/1997 Yen et al. .................... 438/275
6,251,732 B1 * 6/2001 Hsu ............................ 438/276
6,403,424 B1 * 6/2002 Lee et al. .................... 438/280

* cited by examiner

Primary Examiner—Kin-Chan Chen
(74) Attorney, Agent, or Firm—Rosenberg, Klein & Lee

(57) ABSTRACT

A method for implanting and coding a read-only memory with automatic alignment at four corners includes the steps of: etching back the shielding layer on the spaced-striped first polysilicon layers; forming a spacing layer on the gate oxide layer and between the striped first polysilicon layers; depositing a second polysilicon layer overlying the spacing layer and the spaced-striped first polysilicon layer; exposing the gate oxide layer and etching the second polysilicon layer to become a plurality of striped second polysilicon layers; depositing an isolating layer on an etched portion of the striped first polysilicon layers and an etching portion of the striped second polysilicon layers; and using the striped second polysilicon layer as a mask, code areas are defined.

14 Claims, 5 Drawing Sheets

METHOD FOR IMPLANTING AND CODING A READ-ONLY MEMORY WITH AUTOMATIC ALIGNMENT AT FOUR CORNERS

FIELD OF THE INVENTION

The present invention relates to a method for implanting and coding a read-only memory with automatic alignment at four corners, which is especially used in a mask memory, wherein the isolating layer and spacing layer are used for implantation and coding so that the code areas are aligned automatically.

BACKGROUND OF THE INVENTION

Read-only memories are widely used in various digital devices, such as microcomputers, microprocessors, etc. for storing the fixing programs of these systems. Read-only memories are solid memories. In general, the customer sends programs to the memory manufacturing plant. Then the plant programs the programs into a read-only memory so as to be formed with a product which is then sent to the customer. The manufacturing process of read-only memory is very complex and many steps are necessary to be executed. Each step needs a great deal of time, which includes the process of manufacturing material and control of every factors. For most ROM parts, other than those stored in the programming, the other structures are identical. Therefore, the ROM is produced to a semi-product before programming for being stocked in advance. After being ordered by customers, optic masks are made. Then after programmed, it is sent to the customers so as to provide a preferred service. Therefore, the mask ROM after programmed is a general product in the industry.

However, in the prior art mask memory, it often occurs that the mask is misaligned. It can not be completely avoided in the manufacturing process of an integrated circuit. Furthermore, if in the process of the ion implantation in manufacturing a read-only memory, a misalignment occurs. Since the transversal diffusion of the implantation impurities, the adjacent memory cell will be closed. For example, initially, the cell is preset as an "ON" cell, or the adjacent cell is a lower read current. Especially for the memory cell far away from the voltage input point, the current is affected greatly.

Referring to FIGS. 1 and 2, a cross sectional view and an upper view of a prior art read-only memory is illustrated. As shown in the figures, the memory includes a transversal N source/drain region 10 which are bit lines and longitudinal polysilicon gate areas 12, which are word lines. A channel 14 is formed between two adjacent bit lines 10. Stacked gate oxide layer 16 and word lines 12 are arranged above the channel region 14. In the programming process, by the photoresist layer 18 on the programming optic mask so as to expose the channel regions to be written, for example, the code areas 20 and 22, wherein the code area 20 is not aligned, while the code area 22 is aligned. Next, the process of ion implantation is performed so that the memory cell is cut off forever. Therefore, object of writing code is achieved.

However, if the programming mask is misaligned, then the implanted ion will diffuse transversally and possibly enter into the adjacent memory cells so as to partly cut off to reduce the read current, even an error judgment occurs.

SUMMARY OF THE INVENTION

A primary object of the present invention is to provide a method for implanting and coding a read-only memory with automatic alignment at four corners for isolating each code area by each isolating layer and spacing layer so that as in implanting and coding, the code area can be aligned automatically.

In accordance with the object of this invention, a method for implanting and coding a read-only memory with automatic alignment at four corners for being used in a mask memory has been achieved. The method comprises the following steps. The shielding layer is etched back on the striped first polysilicon layers. A spacing layer is formed on the gate oxides and between the striped first polysilicon layers. A second polysilicon layer covers the spacing layer and the striped first polysilicon layers. The second polysilicon layer and the striped first polysilicon layers are etched until the gate oxides are exposed and the second polysilicon layer becomes a plurality of striped second polysilicon layers. An isolating layer is deposited on an etching portion of the striped first polysilicon layers and an etching portion of the striped second polysilicon layers. The striped second polysilicon layer acts as a mask and code areas are defined for performing the process of implantation and coding.

The various objects and advantages of the present invention will be more readily understood from the following detailed description when read in conjunction with the appended drawing.

DETAILED DESCRIPTION OF THE PREFERRED EMBODIMENTS

Referring to FIGS. 3 to 7, there are illustrated the cross sectional view and partial perspective view of a preferred embodiment of the present invention is illustrated.

Figure 1:
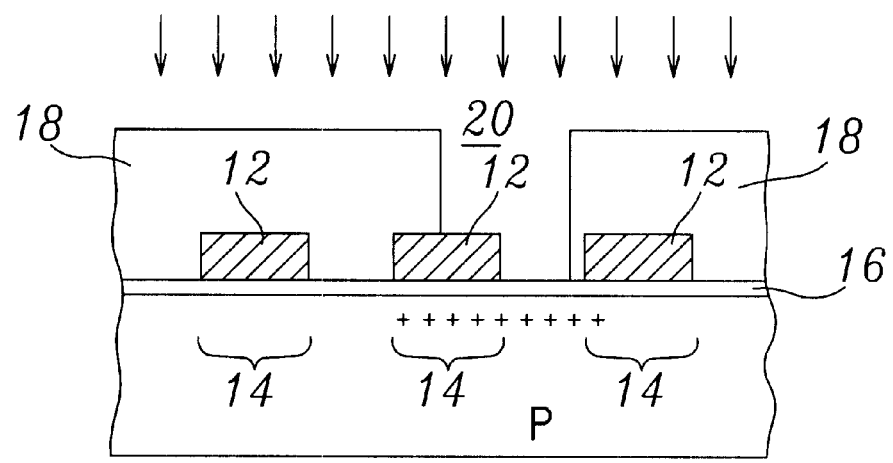
FIG. 1 is a schematic cross sectional view of a prior art read-only memory.
Figure 2:
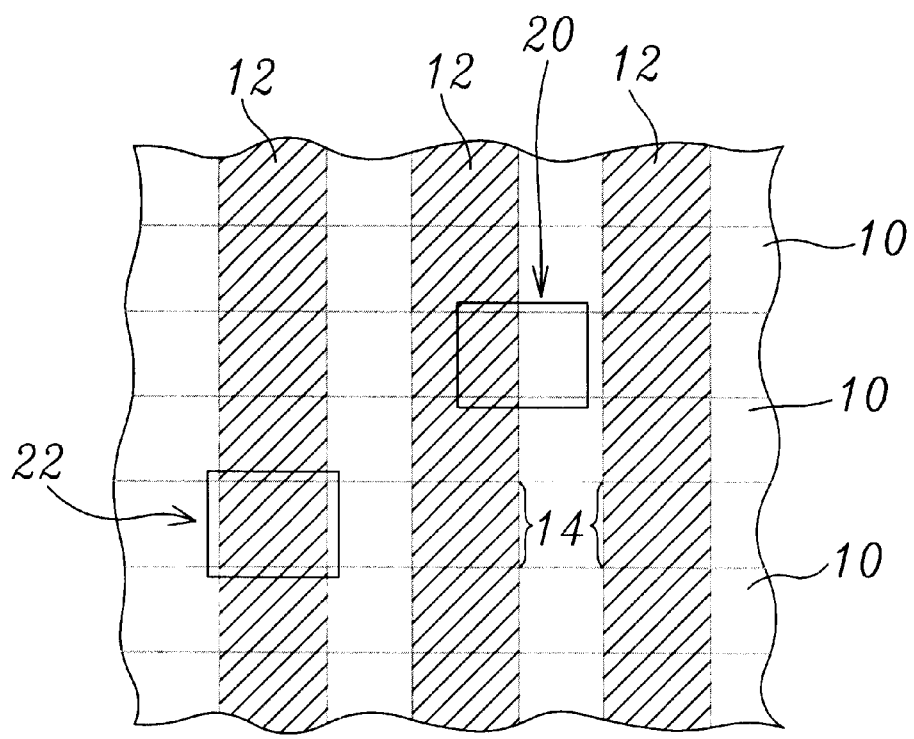
FIG. 2 is a schematic view showing the layout of the prior art read-only memory.
Figure 3:
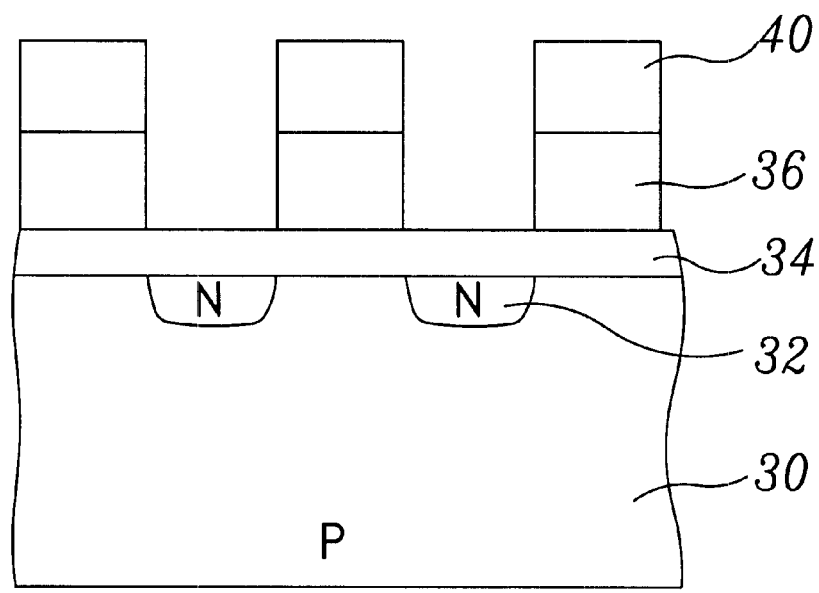
FIGS. 3 to 7B are the cross sectional view and partial perspective view of a preferred embodiment of the present invention, showing the steps of the present invention.

A memory cell structure of a mask memory is provided. The memory cell comprises a P type substrate 30 with an N type ion implantation bit line 32 and being deposited with a gate oxide layer 34. The spaced-striped first polysilicon layer 36 is formed overlying on the gate oxide layer 34. Photoresist layer 40 is formed overlying the spaced-striped first polysilicon layer 36, as shown in FIG. 3.

Figure 4:
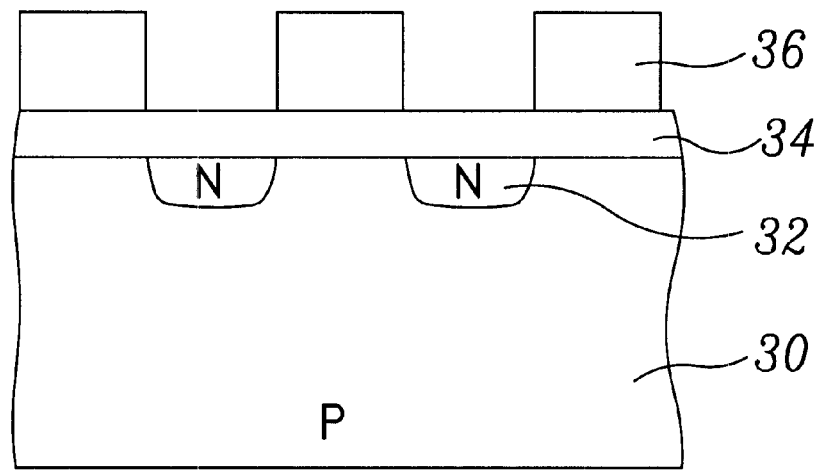

An etch back process is performed on the photoresist layer 40 on the spaced-striped first polysilicon layer 36, as shown in FIG. 4.

Figure 5:
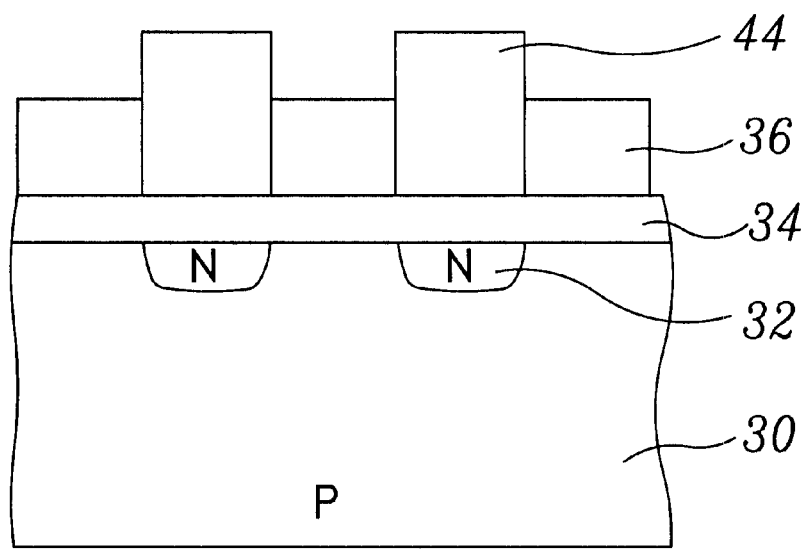

The spacing oxide layer 44 is formed between the spaced-striped first polysilicon layers 36, and the thickness of the spacing oxide layer 44 must be larger than that of the spaced-striped first polysilicon layer 36, as shown in FIG. 5.

Figure 6A:
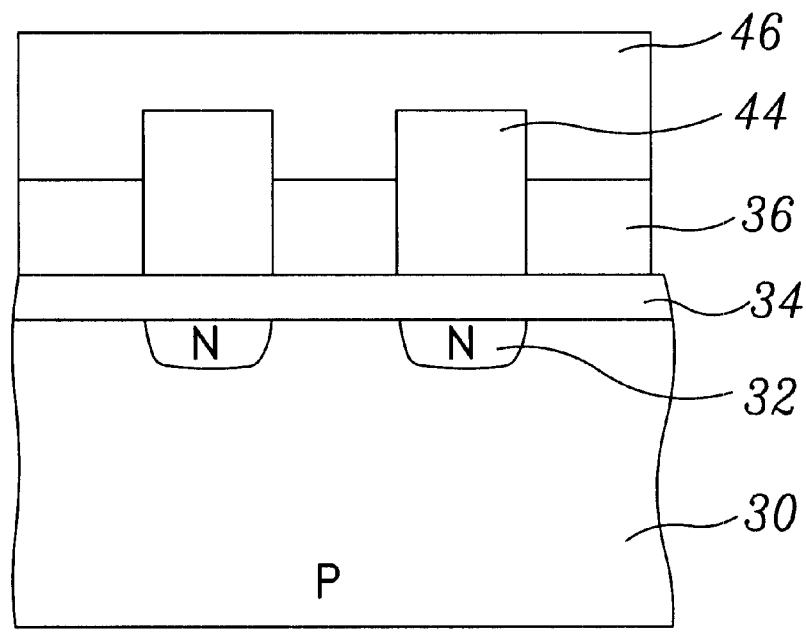

A second polysilicon layer 46 is deposited overlying the spaced-striped first polysilicon layers 36 and spacing oxide layers 44, as shown in FIG. 6A.

Figure 6B:
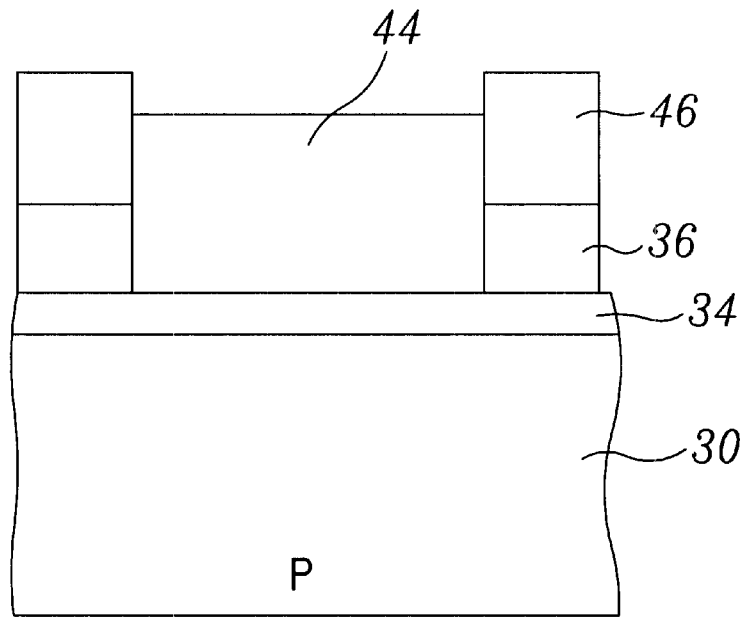
Figure 6C:
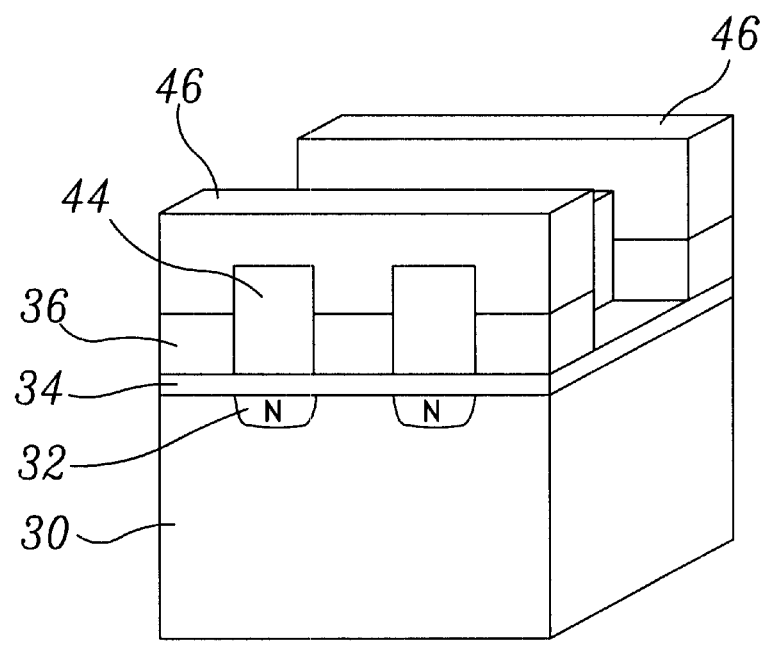

The second polysilicon layer 46 and the spaced-striped first polysilicon layers 36 are etched to expose the gate oxide layer 34 so that the second polysilicon layer 46 becomes a plurality of strips. The spaced-stripped second polysilicon layer 46 and the bit lines 32 are vertically alternatively arranged so as to be formed with word lines, as shown in FIGS. 6A and 6B which are a schematic perspective view and a schematic cross sectional view.

Figure 7A:
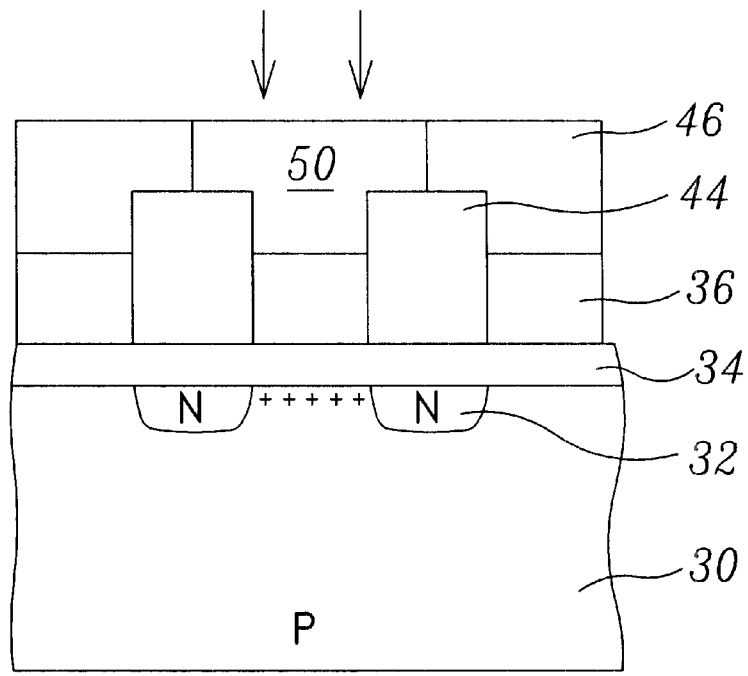
Figure 7B:
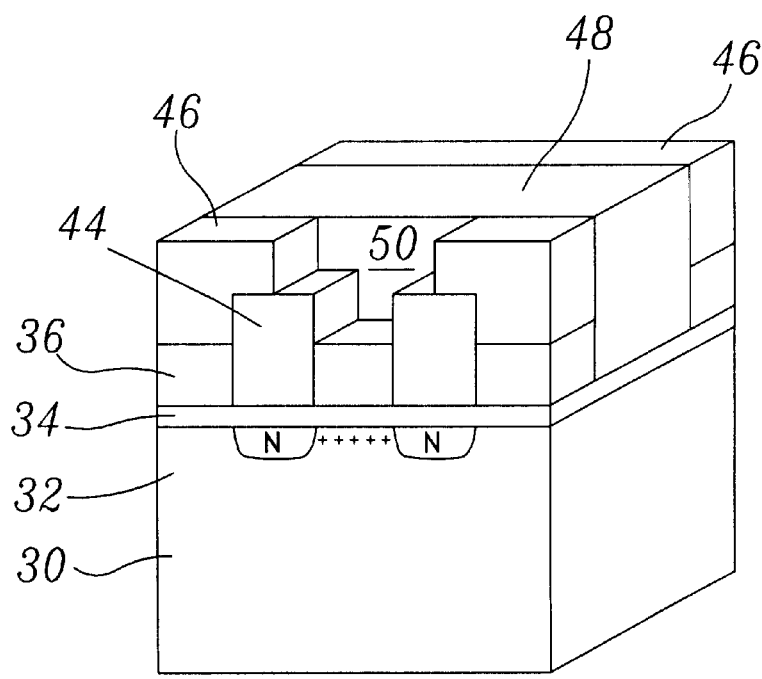

An isolating oxide layer 48 is formed overlying the second polysilicon layers 46 and the first polysilicon layers 36. Thereby, each second polysilicon layer 46 is isolated by the isolating oxide layer 48. Therefore, when defining a writing window 50 in the word line, i.e., at a proper portion of the stripped second polysilicon layer, the spacing oxide layer 44 and the isolating oxide layer 48 serve to isolate the first polysilicon layer 36 and the second polysilicon layer 46 for performing the process of implanting boron ion or fluorine ion ($BF_2$) code writing so as to achieve the object of aligning automatically, as illustrated in FIGS. 7A and 7B which are a schematic cross sectional view and a schematic perspective view.

The present invention provides a method for implanting and coding a read-only memory with automatic alignment at four corners, which is especially used to a mask memory. By using the isolating layers and spacing layers, the code area can be aligned automatically as implanting and coding. However, aforesaid is a preferred embodiment instead of confining the range of the present invention. For example the P type substrate can be replaced by an N type substrate, and the N type ion implanting bit line can be replaced by P type ion implanting bit line.

While the invention has been particularly shown and described with reference to the preferred embodiments thereof, it will be understood by those skilled in the art that various changed in form and details may be made without departing from the spirit and scope of the invention.

What is claimed is:

1. A method for implanting and coding a read-only memory with automatic alignment at four corners for being used in a mask memory; the read-only memory comprising a substrate, bit lines on said substrate; a gate oxide layer on said substrate; and a spaced-striped first polysilicon layer on said gate oxide layer; comprising the steps of:

forming a spacing layer on said gate oxide layer;

depositing a second polysilicon layer overlying said spacing layer and said spaced-striped first polysilicon layer;

etching a part of said second polysilicon layer and said spaced-striped first polysilicon layer to expose said gate oxide layer so that the second polysilicon layer becomes a striped second polysilicon layer;

forming an isolating layer on said etched portion of the spaced-striped first polysilicon layer and said etched portion of the striped second polysilicon layer; and defining code areas by using the striped second polysilicon layer as a mask for performing the process of implantation and coding.

2. The method as claimed in claim 1, wherein a shielding layer formed by a photoresist layer is formed on the spaced-striped first polysilicon layer.

3. The method as claimed in claim 1, wherein said second polysilicon layer comprises a plurality of strips on said spacing layer and the spaced-striped first polysilicon layer.

4. The method as claimed in claim 1, wherein the spacing layer is formed by oxide.

5. The method as claimed in claim 1, wherein said etched portion of said spaced-striped first polysilicon layer, said etched portion of said spaced-striped second polysilicon layer and said isolating layer are formed by oxide.

6. The method as claimed in claim 1, wherein said spacing layer on the gate oxide layer and between the spaced-striped first polysilicon layers has a thickness larger than that of said spaced-striped first polysilicon layer.

7. The method as claimed in claim 1, wherein the etched striped second polysilicon layer is used as a mask for defining code areas, coding is performed by implanting boron ions.

8. A method of manufacturing a read-only memory, comprising:

providing a substrate;

forming bit lines on said substrate;

forming a gate oxide layer on said substrate;

forming a stripe of a first polysilicon layer on said gate oxide layer;

forming a spacing layer on said gate oxide layer beside said first polysilicon layer;

forming a second polysilicon layer overlying said spacing layer and said first polysilicon layer;

etching a part of said second polysilicon layer and a portion of said first polysilicon layer to expose a portion of said gate oxide layer and a portion of said spacing layer so that said second polysilicon layer becomes a striped second polysilicon layer;

forming an isolating layer on said exposed portion of said gate oxide layer and said exposed portion of said spacing layer; and forming a coding area that exposes the first polysilicon layer in the striped second polysilicon layer for coding implantation.

9. The method as claimed in claim 8, wherein a shielding layer formed by a photoresist layer is formed on the first polysilicon layer.

10. The method as claimed in claim 8, wherein said second polysilicon layer is defined by a plurality of strips on said spacing layer and said first polysilicon layer.

11. The method as claimed in claim 8, wherein the spacing layer is formed by oxide.

12. The method as claimed in claim 8, wherein said etched portion of said first polysilicon layer, said etched portion of said second polysilicon layer and said isolating layer are formed by oxide.

13. The method as claimed in claim 1, wherein said spacing layer has a thickness larger than that of said first polysilicon layer.

14. The method as claimed in claim 8, wherein said etched second polysilicon layer is used as a mask for defining code areas and coding is performed by implanting boron ions.

\* \* \* \* \*